(12) United States Patent
Kuo et al.

(10) Patent No.: US 9,343,356 B2
(45) Date of Patent: May 17, 2016

(54) BACK END OF THE LINE (BEOL) INTERCONNECT SCHEME

(71) Applicant: Taiwan Semiconductor Manufacturing Co., Ltd., Hsin-Chu (TW)

(72) Inventors: Chi-Liang Kuo, Hsinchu (TW); Tz-Jun Kuo, Zhudong Township (TW); Hsiang-Huan Lee, Jhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/771,175

(22) Filed: Feb. 20, 2013

(65) Prior Publication Data
US 2014/0231998 A1 Aug. 21, 2014

(51) Int. Cl.
*H01L 21/4763* (2006.01)
*H01L 21/768* (2006.01)
*H01L 23/532* (2006.01)

(52) U.S. Cl.
CPC .... *H01L 21/76832* (2013.01); *H01L 21/76829* (2013.01); *H01L 21/76831* (2013.01); *H01L 21/76834* (2013.01); *H01L 21/76843* (2013.01); *H01L 21/76849* (2013.01); *H01L 21/76867* (2013.01); *H01L 21/76885* (2013.01); *H01L 23/53233* (2013.01); *H01L 23/53238* (2013.01);
(Continued)

(58) Field of Classification Search
CPC ............... H01L 2924/00014; H01L 21/768; H01L 2924/001029; H01L 21/76877; H01L 21/76834; H01L 21/76816; H01L 21/76825; H01L 21/76898; H01L 21/823475

USPC ......... 438/622, 625, 627, 674, 676, 677, 678, 438/687; 257/E21.575
See application file for complete search history.

(56) References Cited

U.S. PATENT DOCUMENTS

| 8,039,966 B2 * | 10/2011 | Yang et al. ................. 257/773 |
| 2004/0192037 A1 * | 9/2004 | Barns .......................... 438/687 |
| 2008/0105979 A1 * | 5/2008 | Whelan et al. .............. 257/751 |

(Continued)

FOREIGN PATENT DOCUMENTS

| TW | 200739892 | 10/2007 |
| TW | 200848495 A | 12/2008 |
| TW | 200850099 A | 12/2008 |

OTHER PUBLICATIONS

Eugene J. O'Sullivan; "Electroless Desposition"; Electrochemistry Encyclopedia; http://electrochem.cwru.edu/encycl/art-d02-eless-dep.htm; Oct. 2, 2012, p. 1-18.

(Continued)

*Primary Examiner* — Thanhha Pham
(74) *Attorney, Agent, or Firm* — Eschweiler & Associates, LLC (57) ABSTRACT

The present disclosure relates to a method of forming a back-end-of-the-line metal interconnect layer. The method is performed by depositing one or more self-assembled monolayers on a semiconductor substrate to define a metal interconnect layer area. A metal interconnect layer having a plurality of metal structures is formed on the semiconductor substrate within the metal interconnect layer area. An inter-level dielectric layer is then formed onto the surface of the semiconductor substrate in areas between the plurality of metal structures.

19 Claims, 8 Drawing Sheets

(52) U.S. Cl.
CPC .... *H01L 23/53266* (2013.01); *H01L 23/53295* (2013.01); *H01L 2924/0002* (2013.01)

(56) References Cited

U.S. PATENT DOCUMENTS

| | | |
|---|---|---|
| 2010/0052080 A1 | 3/2010 | Garcia Tello et al. |
| 2011/0177236 A1* | 7/2011 | Lazovsky et al. ............. 427/123 |
| 2013/0230981 A1 | 9/2013 | Kawamura |

OTHER PUBLICATIONS

Jiang, et al. "Pattern design in large area using octadecyltrichlorosilane self-assembled monolayers as resist material." Applied Surface Science 252 (2006) 4230-4235. Aug. 2, 2005.

Masuda, et al. "Site-selective deposition and micropatterning of tantalum oxide thin films using a monolayer." Journal of the European Ceramic Society 24 (2004) 301-307. Published in 2004.

* cited by examiner

BACK END OF THE LINE (BEOL) INTERCONNECT SCHEME

BACKGROUND

Modern day integrated chips contain millions of semiconductor devices. The semiconductor devices are electrically interconnected by way of back-end-of-the-line metal interconnect layers that are formed above the devices on an integrated chip. A typical integrated chip comprises a plurality of back-end-of-the-line metal interconnect layers including different sized metal wires vertically coupled together with metal contacts (i.e., vias).

Back-end-of-the-line metal interconnect layers are often formed using a dual damascene process. In a dual damascene process, a dielectric material is deposited (e.g., low k dielectric, ultra low k dielectric) onto the surface of a semiconductor substrate. The dielectric material is then selectively etched to form cavities in the dielectric material for a via layer and for an adjoining metal layer. In a typical via-first dual damascene process, a via hole is first etched in the dielectric material and then a metal line trench is formed on top of the via hole. After the via and trench are formed, a diffusion barrier layer and a seed layer are deposited within the cavities. An electro chemical platting process is then used to fill the via and metal trenches with metal (e.g., copper) at the same time. Finally, the surface of the substrate is planarized using a chemical mechanical polishing process to remove any excess metal.

DETAILED DESCRIPTION

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It will be appreciated that the details of the figures are not intended to limit the disclosure, but rather are non-limiting embodiments. For example, it may be evident, however, to one of ordinary skill in the art, that one or more aspects described herein may be practiced with a lesser degree of these specific details. In other instances, known structures and devices are shown in block diagram form to facilitate understanding.

Dual damascene metallization processes are subject to a number of potential etching defects that may affect the quality of the metal interconnect layers. For example, to prevent a metal line trench from further etching the underlying via hole, a photoresist plug is inserted in the via hole before the metal line trench is etched. If the photoresist plug is formed to a height that is too high, the dielectric material may be under-etched leaving fence defects. In contrast, if the photoresist plug is formed to a height that is too low, the dielectric material may be over-etched leaving facet defects. Also, etching may damage the dielectric material during PR stripping (e.g., damage to the dielectric trench side-wall). Such etching defects may result in voids or pit defects that negatively affect the reliability of metal interconnect wires.

Accordingly, the present disclosure relates to a method of forming a back-end-of-the-line metal interconnect layer that reduces damage to a dielectric material surrounding the metal interconnect layer. The method is performed by depositing one or more self-assembled monolayers on a semiconductor substrate to define a metal interconnect layer area. A metal interconnect layer having a plurality of metal structures is formed on the semiconductor substrate within the metal interconnect layer area. An inter-level dielectric layer is then formed on the semiconductor substrate in areas between the plurality of metal structures. By using one or more self-assembled monolayers to form a metal interconnect layer prior to depositing an inter-level dielectric layer, etching damage to the inter-level dielectric layer is reduced.

Figure 1:
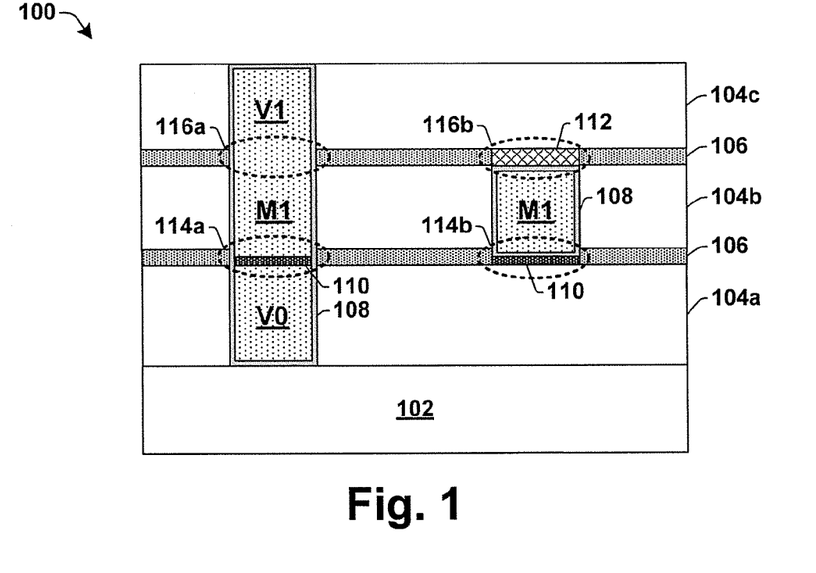
FIG. 1 illustrates a cross-sectional view of some embodiments of a back-end-of-the-line stack formed using self-assembled monolayers.

FIG. 1 illustrates a cross-sectional view 100 of some embodiments of an integrated chip having a disclosed back-end-of-the-line metal interconnect stack.

The integrated chip comprises a semiconductor substrate 102. A first inter-level dielectric (ILD) layer 104a is disposed on the semiconductor substrate 102 and a first metal interconnect layer V0, comprising a plurality of metal structures, is disposed within the first ILD layer 104a. The first metal interconnect layer V0 may comprise a contact/via layer that provides for a vertical interconnection that extends through the first ILD layer 104a. In some embodiments, the first metal interconnect layer V0 may comprise a plurality of conductive contacts (e.g., tungsten, copper, etc.) that connect the back-end-of-the-line metal interconnect stack (e.g., metal interconnect layers M1, V1, etc.) to a plurality of semiconductor devices within the semiconductor substrate 102.

A first self-assembled monolayer (SAM) 106 is located above the first ILD layer 104a. The first SAM 106 comprises an ordered assembly of organic molecules comprising a head group in contact with the first ILD layer 104a, and a terminal group, which is connected to the head group by a molecular chain. The first SAM 106 extends along a top surface of the first ILD layer 104a and comprises a plurality of openings 114a-114b that expose an underlying material. A second ILD layer 104b is disposed above the first SAM 106. A second metal interconnect layer M1, comprising a plurality of metal structures, is disposed within the second ILD layer 104b and within at least one of the plurality of openings 114a-114b in the first SAM 106. The second metal interconnect layer M1 may comprise a first thin copper metal layer.

In some embodiments, a metal catalyst layer 110 is located at a bottom of the second metal interconnect layer M1 within one or more of the plurality of openings 114a-114b. The metal catalyst layer 110 separates the second metal interconnect layer M1 from an underlying material. For example, the metal catalyst layer 110 may be located at the bottom of a copper or alloy interconnect layer M1 that is disposed above first ILD layer 104a or at the bottom of a copper interconnect layer M1 that is disposed above a first metal interconnect layer V0 made of a conductive material (e.g., tungsten, copper, etc.). In some embodiments, the metal catalyst layer 110 comprises palladium.

A first self-assembled monolayer (SAM) 106 is also located above the second ILD layer 104b. The first SAM 106 extends along a top surface of the second ILD layer 104b and comprises a plurality of openings 116a-116b that expose an underlying material. A second self-assembled monolayer (SAM) 112 is located above the second metal interconnect layer M1 in at least one opening 116b in first SAM 106. The second SAM 112 comprises an ordered assembly of organic molecules comprising a head group in contact with the second metal-interconnect layer M1, and a terminal group, which is connected to the head group by a molecular chain.

The first and second SAMs, 106 and 112, comprise head groups (on a bottom surface) and terminal groups (on a top surface). In some embodiments, the first and second SAMs, 106 and 112, comprise terminal groups that are hydrophobic (i.e., prevent adhesion). For example, the metal catalyst layer 110 will not adhere on a hydrophobic surface of the first and second SAMs, 106 and 112, and therefore instead forms in openings (e.g., 114 or 116) of the first or second SAMs, 106 and 112. In some embodiments, the first and second SAMs, 106 and 112, comprise head groups that determine whether a SAM would adhere to an underlying metal surface or an underlying dielectric surface. For example, the first SAM 106 may comprise a head group that allows it to adhere to an underlying dielectric surface, while the second SAM 112 may comprise a head group that allows it to adhere to an underlying metal surface.

A third metal interconnect layer V1, comprising a plurality of metal structures, is located above the second metal interconnect layer M1 in an opening 116a in first SAM 106. The third metal interconnect layer V1 is vertically coupled to the underlying second metal interconnect layer M1 and extends vertically through the third ILD layer 104c and first SAM 106. A third ILD layer 104c is located on first SAM 106 in an area between the plurality of metal structures of the third metal interconnect layer V1.

In some embodiments, two adjacent metal interconnect layers may comprise a same material. For example, the second metal interconnect layer M1 and the third metal interconnect layer V1 may comprise copper. In such embodiments, the adjacent metal interconnect layers form an uninterrupted metal structure (e.g., a second metal interconnect layer M1 and the third metal interconnect layer V1 form an uninterrupted copper material with no metal catalyst layer disposed there between).

A self-forming barrier layer 108 is located between the metal interconnect layers V0, M1, V1 and ILD layers 104a-104c. The self-forming barrier layer 108 prevents metal molecules within the metal interconnect layers V0, M1, V1 from diffusing into the ILD layers 104a-104c. In some embodiments, the self-forming barrier layer 108 comprises metal oxide or metal silicate oxide.

Figure 2:
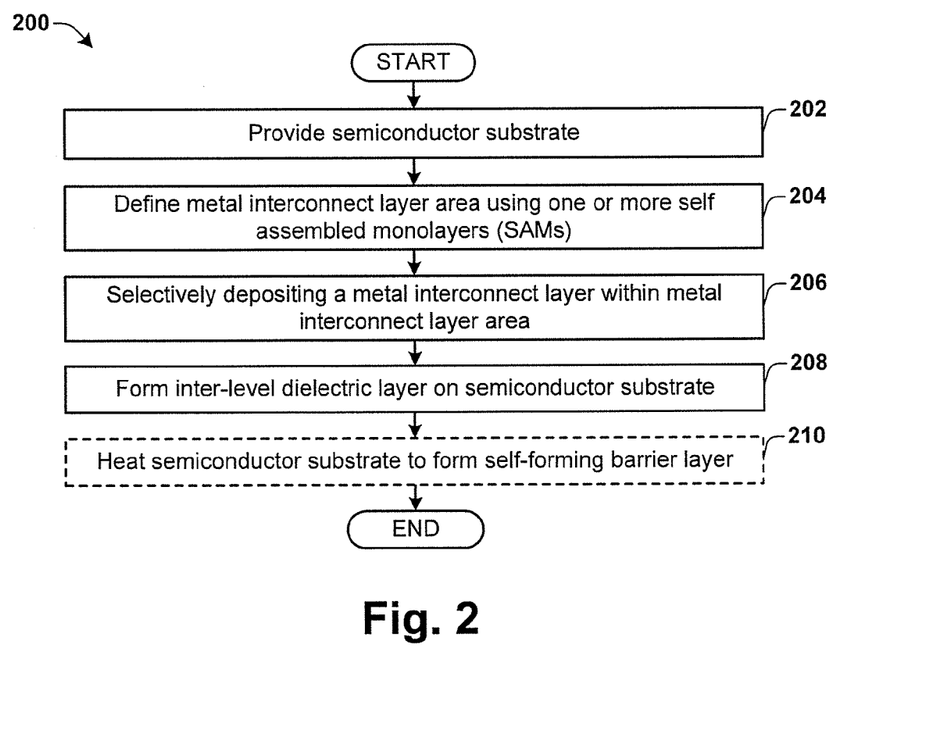
FIG. 2 is a flow diagram of some embodiments of a method for forming a back-end-of-the-line metal interconnect layer.

FIG. 2 illustrates a flow diagram of some embodiments of a method 200 for forming a back-end-of-the-line interconnect layer on an integrated chip. It will be appreciated that acts 204-208 of method 200 may be iteratively performed to form a plurality of metal interconnect layers within a back-end-of-the-line metal interconnect stack.

At act 202, a semiconductor substrate is provided.

At act 204, a metal interconnect layer area is defined on the semiconductor substrate using one or more self-assembled monolayers (SAMs). The metal interconnect layer area is an area where metal structures of a metal interconnect layer (e.g., a metal trench or a metal via) are to be subsequently formed. The metal interconnect layer area is defined by depositing one or more self-assembled monolayers on a surface of the semiconductor substrate.

In some embodiments, a metal interconnect layer area is defined by depositing a SAM outside of the metal interconnect layer area that has a terminal group with an interfacial property that prevents metal from easily adhering to the SAM. In such embodiments, the SAM will allow metal to accumulate within the metal interconnect layer area while preventing metal from accumulating outside of the metal interconnect layer area.

In some other embodiments, the metal interconnect layer area is defined by depositing one or more SAMs onto the semiconductor substrate and subsequently opening a metal interconnect layer area on the surface of the semiconductor substrate. The one or more SAMs have a terminal group with an interfacial property that does not allow metal to easily adhere to the one or more SAMs, while the openings of metal interconnect layer area have an interfacial property that allows metal to easily adhere to the openings of metal interconnect layer area.

At act 206, a metal interconnect layer comprising a plurality of metal structures is selectively deposited on the semiconductor substrate within the metal interconnect layer area. The metal interconnect layer may comprise a metal wire layer configured to provide lateral interconnections or a metal via layer configured to provide vertical interconnections. In some embodiments, the metal interconnect layer is formed using an electroless plating process that generates the plurality of metal structures from a seed material located in the metal interconnect layer area. In some embodiments, the seed material may comprise an underlying metal interconnect layer, while in other embodiments the seed material may comprise a metal catalyst layer. In some embodiments, the metal interconnect layer may comprise a first metal (e.g., copper) doped with a doping alloy comprising a second metal (e.g., molybdenum) having a lower concentration than the first metal.

At 208, an ILD layer is formed on the semiconductor substrate. The ILD layer is formed on the semiconductor substrate in a manner that fills in areas between the plurality of metal structures of the metal interconnect layer. In some embodiments, the ILD layer may comprise a low-k dielectric layer or an ultra low-k dielectric layer.

At 210, the semiconductor substrate is heated to form a self-forming barrier layer. The self-forming barrier layer is formed at an interface between a metal interconnect layer and an ILD layer by a reaction between the doping allow and the ILD layer. The self-forming barrier layer prevents diffusion of the metal interconnect layer into the ILD layer.

Therefore, method 200 generates a metal interconnect layer by forming the metal structures in an area defined by one or more self-assembled monolayers and then by subsequently forming an ILD layer between the metal structures. One of ordinary skill in the art will appreciate that because the ILD layer is formed onto the metal structures, the etching problems present in traditional dual damascene processes (e.g., over etching the ULK, facet defects, fence defects, etc.) are eliminated.

Figure 3:
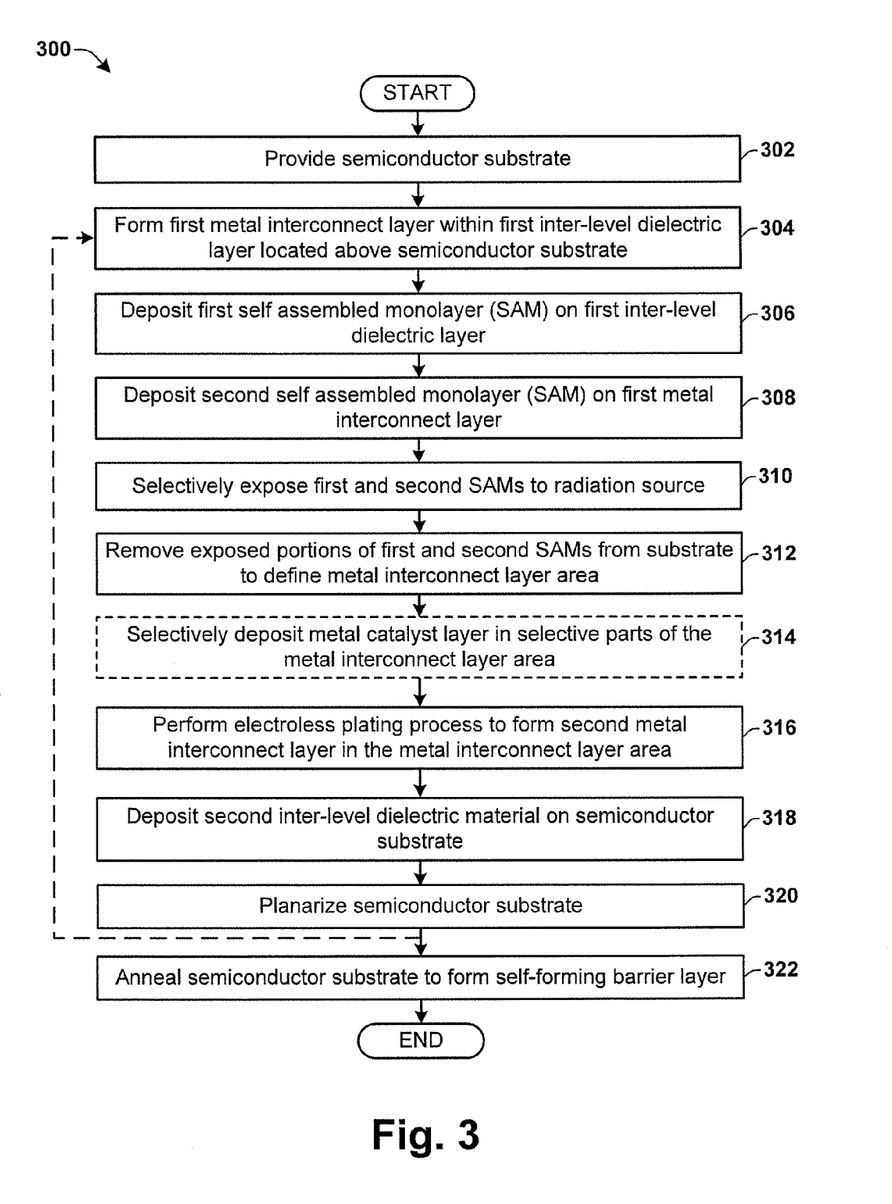
FIG. 3 is a flow diagram of some embodiments of a method for forming a back-end-of-the-line metal interconnect layer.

FIG. 3 illustrates a flow diagram of some embodiments of an exemplary method 300 for forming a back-end-of-the-line (BEOL) metal interconnect layer on an integrated chip.

While the disclosed methods (e.g., methods 200 and 300) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

At act 302, a semiconductor substrate is provided. The semiconductor substrate may comprise any type of semiconductor body (e.g., silicon, SiGe, SOI) such as a semiconductor wafer and/or one or more die on a wafer, as well as any other type of semiconductor and/or epitaxial layers associated therewith. In some embodiments, the semiconductor substrate comprises a silicon starting material, such as a single-crystal silicon with a <100> orientation. In other embodiments, the semiconductor substrate may an epitaxial layer grown on the surface of the substrate.

At act 304, a first metal interconnect layer is formed within a first ILD layer that is disposed above the semiconductor substrate. In some embodiments, the first metal interconnect layer may comprise a via/contact layer that connects a back-end-of-the-line metal interconnect stack (e.g., metal interconnect layers M1, V1, etc.) to a plurality of semiconductor devices within the semiconductor substrate.

At act 306, a first self-assembled monolayer (SAM) is selectively deposited on the first ILD layer. The first SAM comprises a head group connected to a terminal group by a molecular chain. In some embodiments, the head group comprises a hydrophilic interfacial property that causes the first SAM to be attracted to the first ILD layer, thereby allowing the first SAM to easily adhere to the first ILD layer, but not to the first metal interconnect layer. In some embodiments, terminal group provides a hydrophobic interfacial property. The hydrophobic interfacial property repels metal, thereby preventing metal from adhering to the first SAM.

At act 308, a second self-assembled monolayer (SAM) is selectively deposited on the first metal interconnect layer. The second SAM comprises a head group connected to a terminal group by a molecular chain. In some embodiments, the head group comprises a hydrophilic interfacial property that causes the second SAM to be attracted to the first metal interconnect layer, thereby allowing the second SAM to easily adhere to the first metal interconnect layer, but not to the first ILD layer. In some embodiments, terminal group provides a hydrophobic interfacial property that repels metal, thereby preventing metal from adhering to the second SAM.

At act 310, the first and/or second SAMs are selectively exposed to a radiation source to photo pattern the first and second SAMs. In some embodiments, the radiation source may comprise a source of ultraviolet radiation that generates an ultraviolet (UV) radiation pattern. Selectively exposing the first and/or second SAMs to the ultraviolet radiation pattern degrades the exposed areas so that they can be selectively removed without removing areas of the first and second SAM that were not exposed.

At act 312, exposed (i.e., degraded) areas of the first and second SAMs are selectively removed to form one or more openings that define a metal interconnect layer area in which a second metal interconnect layer is to be formed.

At act 314, a metal catalyst layer may be selectively deposited into the metal interconnect layer area. The metal catalyst layer operates as a seed layer from which a metal interconnect layer can be formed though a metal plating process. In some embodiments, the metal catalyst layer may comprise a layer of palladium.

At act 316, an electroless plating process is performed to form a second metal interconnect layer comprising a plurality of freestanding metal structures in the metal interconnect layer area. The electroless plating process forms the second metal interconnect layer with a metal plating process that does not use an electrode.

At act 318, a second ILD layer is formed on the semiconductor substrate in the area between the plurality of freestanding metal structures of the second metal interconnect layer.

In some embodiments, the semiconductor substrate may be planarized at act 320. Planarization of the semiconductor substrate removes excess dielectric and metal material from the substrate to achieve a metal interconnect layer having an appropriate height and a planarized surface upon which a subsequent metal interconnect layer may be formed. In some embodiments, acts 304-320 may be iteratively repeated to form a plurality of metal interconnect layers (e.g., a first metal interconnect layer, a second metal interconnect layer above the first metal interconnect layer, etc.) on the semiconductor substrate.

At act 322, the semiconductor substrate is annealed to form a self-forming barrier layer. During the anneal, the semiconductor substrate is exposed to an elevated temperature. The self-forming barrier layer prevents diffusion of the metal structures into adjacent dielectric material.

Some embodiments of an exemplary semiconductor substrate, whereon method 300 is implemented, are illustrated in cross-sectional views of FIGS. 4-15.

Figure 4:
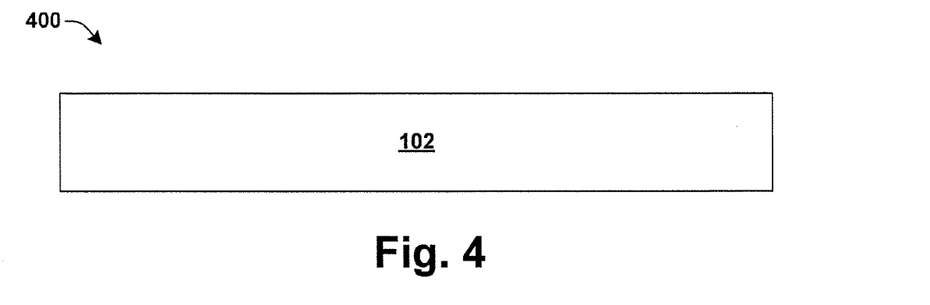
FIGS. 4-16 are cross-sectional views of some embodiments of an example semiconductor substrate upon which a method of forming a back-end-of-the-line metal interconnect layer is performed.

FIG. 4 illustrates some embodiments of a cross-sectional view 400 corresponding to act 302. Cross-sectional view 400 illustrates an example of a semiconductor substrate 102. The semiconductor substrate 102 comprises a non-epitaxial, silicon substrate.

Figure 5:
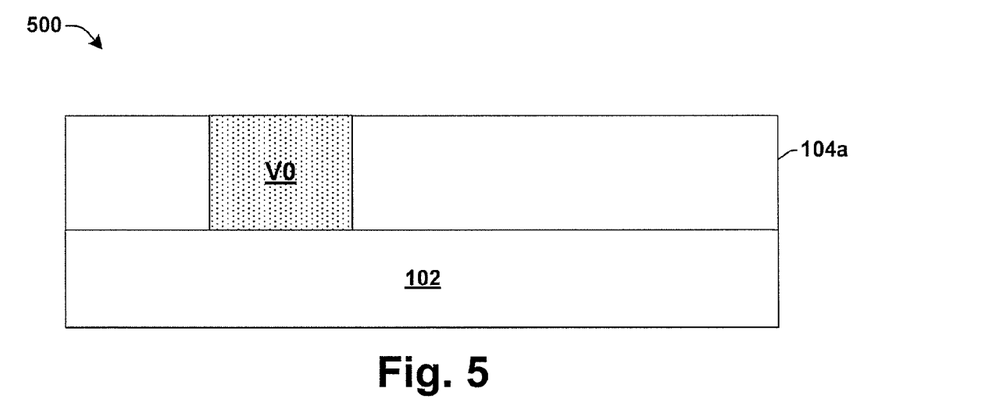

FIG. 5 illustrates some embodiments of a cross-sectional view 500 corresponding to act 304. As shown in cross-sectional view 500, a first ILD layer 104a is formed on the semiconductor substrate 102. A first metal interconnect layer V0 is formed within the first ILD layer 104a. In some embodiments, the first metal interconnect layer V0 comprises a contact/via layer. The contract/via layer may comprise a tungsten material, for example.

Figure 6:
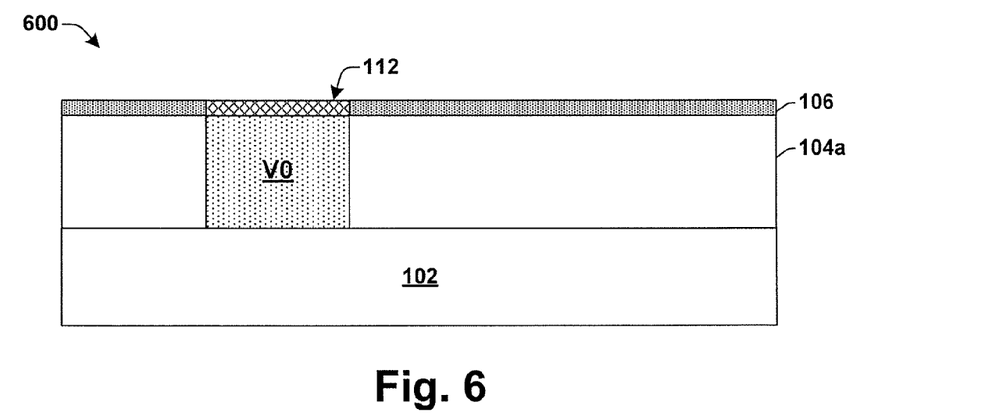

FIG. 6 illustrates some embodiments of a cross-sectional view 600 corresponding to acts 306 and 308. As shown in cross-sectional view 600, a first self-assembled monolayer (SAM) 106 is selectively deposited on the first ILD layer 104a, and a second self-assembled monolayer (SAM) 112 is deposited onto the first metal interconnect layer V0. In some embodiments, the first and second SAM, 106 and 112, are deposited to a thickness that is substantially the same.

In some embodiments, the first SAM 106 comprises a head group that adheres to the first ILD layer 104a but not to the first metal interconnect layer V0, while the second SAM 112 comprises a head group that adheres to the first metal interconnect layer V0. In such embodiments, the first and second SAM, 106 and 112, may be deposited onto the semiconductor substrate 102 by spin coating. Upon being spun onto the semiconductor substrate, the first SAM 106 will adhere to the first ILD 104a, but not to the first metal interconnect layer V0. The second SAM 112 is then spun onto the semiconductor substrate 102 above the first metal interconnect layer V0.

Figure 7A:
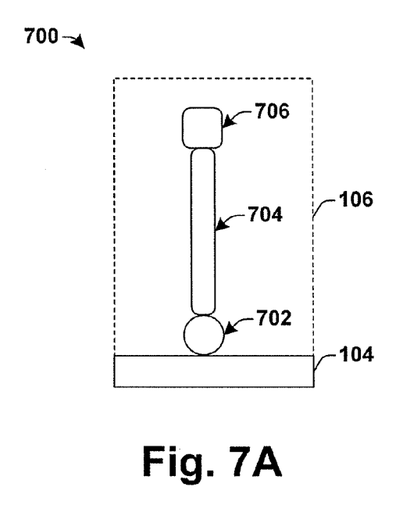
Figure 7B:
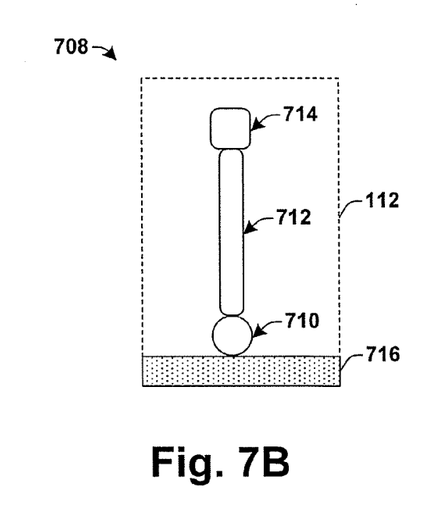

FIGS. 7A-7B illustrate some embodiments of a first SAM and a second SAM as provided herein.

As shown in FIG. 700, the first SAM 106 is formed on a substrate comprising an ILD layer 104. The first SAM 106 comprises a head group 702 connected to terminal group 706 (i.e., functional group) by way of a molecular chain 704 (i.e., tail). The head group 702 has a hydrophilic interfacial property that causes the first SAM 106 to be attracted to ILD layer 104. In some embodiments, the head group 702 may comprise trichlorosilicon ($SiCl_3$) or trimethoxysilane ($Si(OCH_3)_3$), which provide the hydrophilic interfacial property. In some embodiments, the molecular chain 704 may comprise an alkyl chain, such as methylene ($CH_2)_n$, for example. The terminal group 706 has a hydrophobic interfacial property that repels metal, thereby preventing metal from adhering to the first SAM 106. In some embodiments, the terminal group 706 may comprise a methyl group ($CH_3$), which provides the hydrophobic interfacial property.

As shown in FIG. 708, the second SAM 112 is formed on a substrate comprising a metal interconnect layer 716. The second SAM 112 comprises a head group 710 connected to terminal group 714 (i.e., functional group) by way of a molecular chain 712 (i.e., tail). The head group 710 has a hydrophilic interfacial property that causes the second SAM 112 to be attracted to metal interconnect layer 716. In some embodiments, the head group 710 may comprise sulfhydryl or thiol, which provide the hydrophilic interfacial property. In some embodiments, the molecular chain 712 may comprise an alkyl chain, such as methylene $(CH_2)_n$, for example. The terminal group 714 has a hydrophobic interfacial property that repels metal, thereby preventing metal from adhering to the second SAM 112. In some embodiments, the terminal group 714 may comprise a methyl group $(CH_3)$, which provides the hydrophobic interfacial property.

Figure 8:
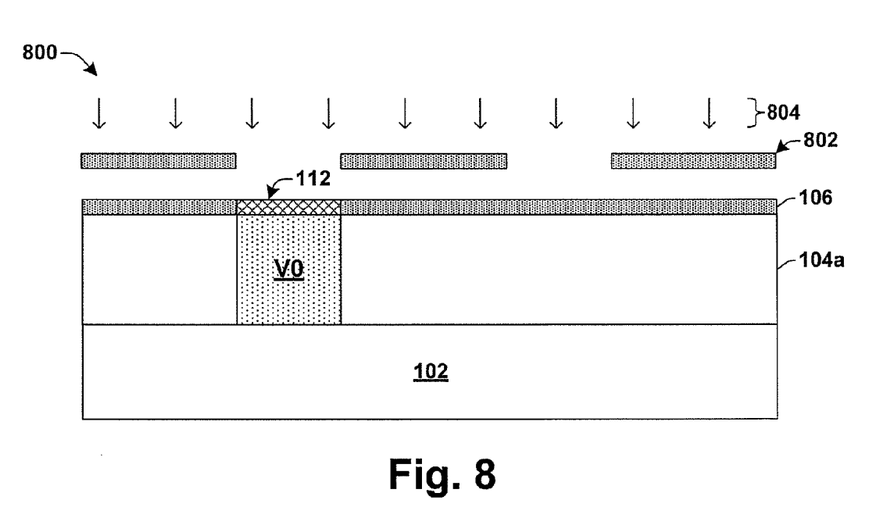

FIG. 8 illustrates some embodiments of a cross-sectional view 800 corresponding to act 312. As shown in cross-sectional view 800, a photomask 802 is used to selectively expose the first and second SAMs, 106 and 112, to ultraviolet radiation 804. In areas of the first and second SAMs, 106 and 112, that are exposed to the ultraviolet radiation 804 the SAM molecules are photo oxidized, which weakens the SAM layers.

Figure 9:
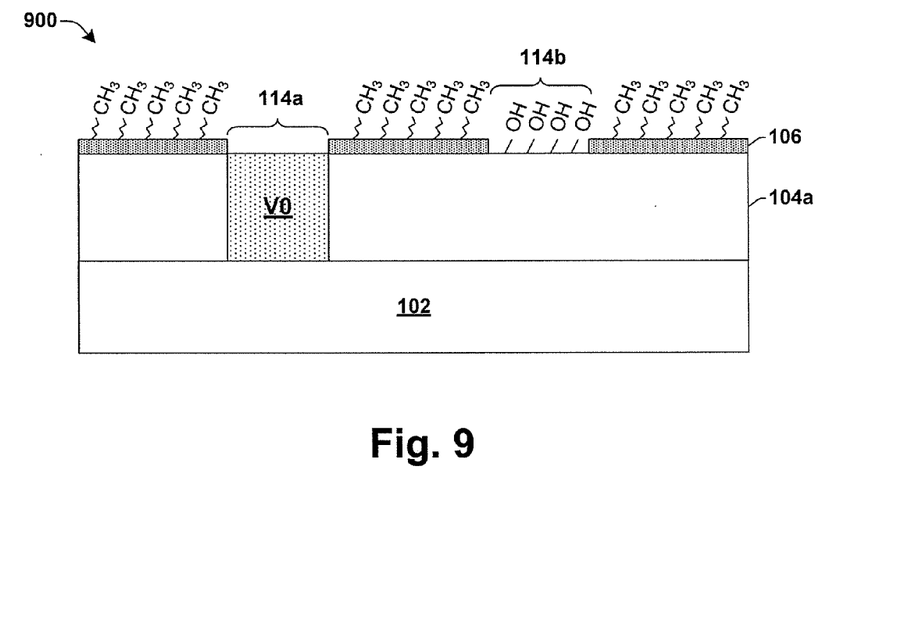

FIG. 9 illustrates some embodiments of a cross-sectional view 900 corresponding to act 312. As shown in cross-sectional view 900, areas of the first and second SAMs, 106 and 112, that were exposed to the ultraviolet radiation 804 are removed from the substrate, resulting in a plurality of openings 114a-114b. In some embodiments, areas of the first and second SAMs, 106 and 112, that were exposed to the ultraviolet radiation 804 may be washed away the SAM molecules using a polar solvent. After removing the first SAM 106 from above the first ILD layer 104a, an exposed surface of first ILD layer 104a may comprise OH bonds. The plurality of openings 114a-114b in the first and second SAM, 106 and 112, define a metal interconnect layer area in which a second metal interconnect layer is to be formed.

Figure 10:
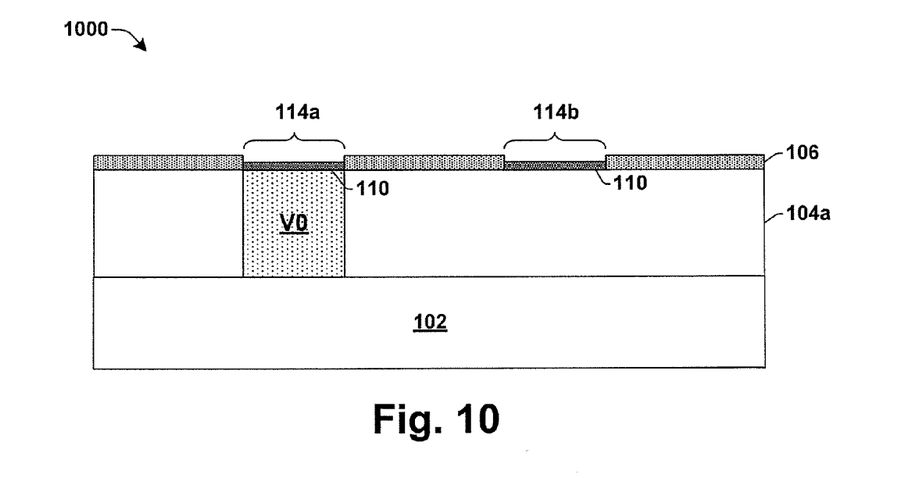

FIG. 10 illustrates some embodiments of a cross-sectional view 1000 corresponding to act 314. As shown in cross-sectional view 1000, a metal catalyst layer 110 is deposited within openings 114a-114b in the first and second SAMs, 106 and 112. In some embodiments, the terminal group (e.g., $CH_3$) of the first and second SAMs, 106 and 112, comprises a hydrophobic surface which prevents the metal catalyst layer (e.g., palladium) from adhering to the substrate in areas covered by the first and second SAMs, 106 and 112. In such embodiments, the metal catalyst layer (e.g., palladium) can be selectively deposited into hydrophilic areas in which the first and second SAMs, 106 and 112, have been removed.

Figure 11:
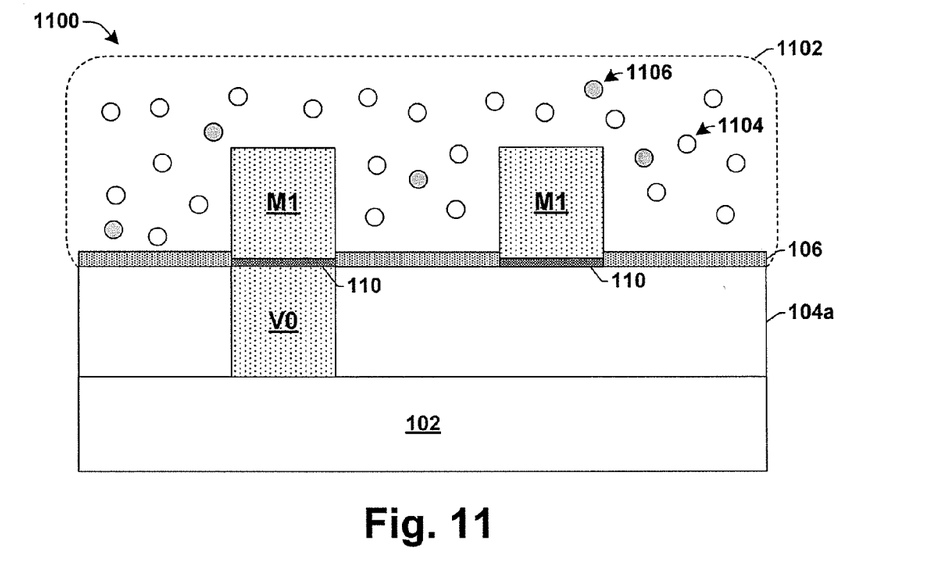

FIG. 11 illustrates some embodiments of a cross-sectional view 1100 corresponding to act 316. As shown in cross-sectional view 1100, an electroless plating process forms freestanding metal structures of a second metal interconnect layer M1 from the metal catalyst layer 110. In some embodiments, the substrate is submerged in an electroless solution 1102 comprising metal ions 1104 (e.g., copper ions) and a reducing agent. The reducing agent in the electroless solution causes metal ions 1104 in the electroless solution 1102 to be deposited on the metal catalyst layer 110 without the application of external electrical power. In some embodiments, the metal ions 1104 comprise copper ions. In other embodiments, the metal ions 1104 may comprise aluminum, tungsten, molybdenum, titanium, titanium nitride, tantalum nitride, or a metal silicide, for example.

In some embodiments, the electroless solution 1102 further comprises an alloy dopant 1106. The alloy dopant 1106 is mixed with the metal ions 1104 so that the resulting freestanding metal structures comprise metal ions 1104 along with the alloy dopant 1106. The alloy dopant 1106 may subsequently be activated though an anneal (e.g., act 320) to form a self-forming barrier layer. In various embodiments, the alloy dopant 1106 comprises one or more of: magnesium (Mg), aluminum (Al), chromium (Cr), manganese (Mn), titanium (Ti), zirconium (Zr), silver (Ag), niobium (Nb), boron (B), indium (In), tin (Sn), molybdenum (Mo).

Figure 12:
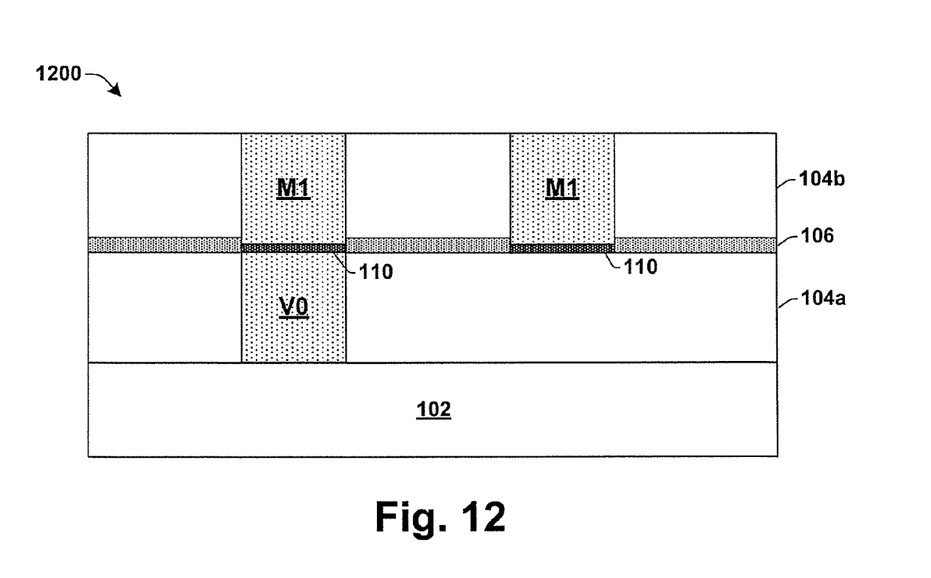

FIG. 12 illustrates some embodiments of a cross-sectional view 1200 corresponding to act 318. As shown in cross-sectional view 1200, a second ILD layer 104b fills in areas between the freestanding metal structures of the second metal interconnect layer M1. In some embodiments, the second ILD layer 104b may comprise an ultra low-k (ULK) spin-on glass (e.g., having a dielectric constant, $k \approx 2.2$). Such a ULK spin-on glass (SOG) is an inter-level dielectric material that can be applied to a substrate in liquid form. The ULK spin-on glass may be deposited onto the surface of the substrate by spin coating and fills in areas between freestanding metal structures, resulting in a substantially planarized ultra low-k dielectric material formed around existing metal and/or contact structures.

In some embodiments, the surface of a semiconductor substrate may be planarized after the second ILD layer 104b is deposited. In some embodiments, the semiconductor substrate may be planarized using a chemical mechanical polishing (CMP) process to removing excess material (e.g., metal, dielectric material) from the surface of the substrate that remain after prior processing acts, for example. The CMP process forms a substantially flat substrate surface.

Figure 13:
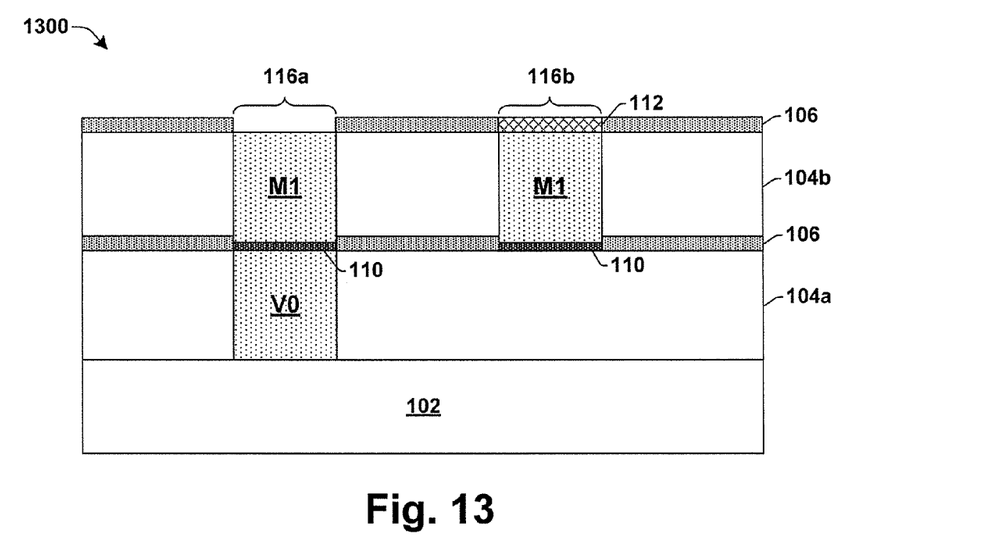
Figure 14:
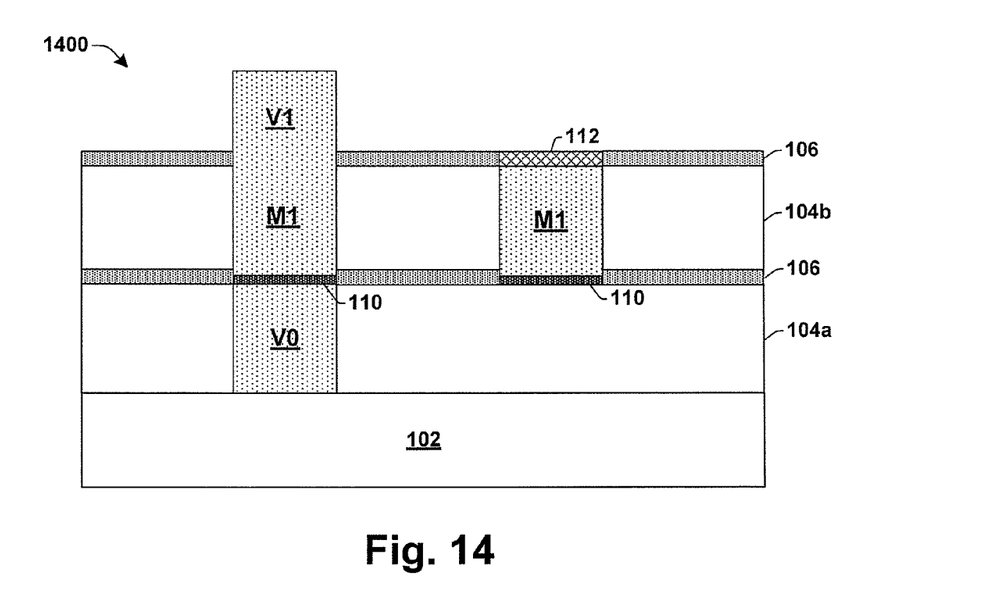
Figure 15:
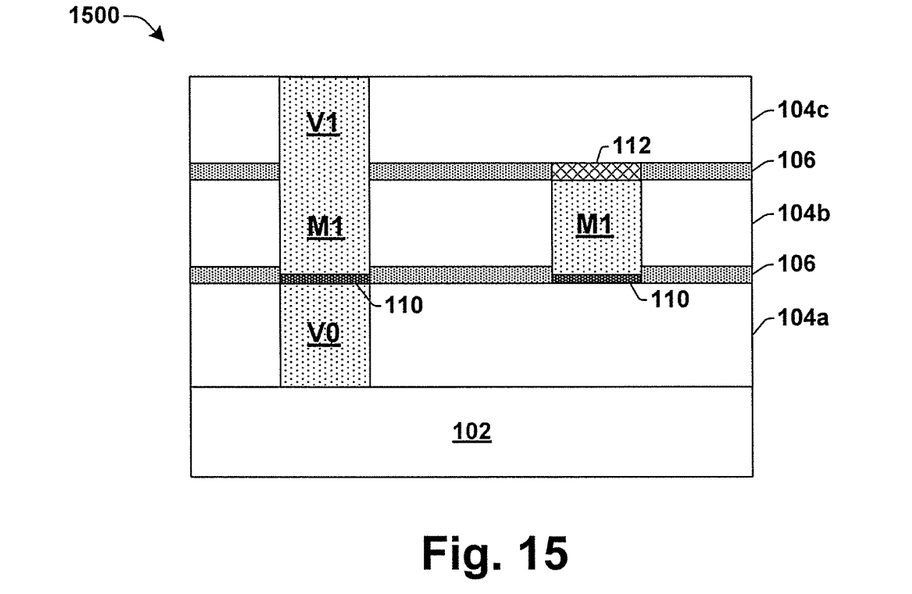

FIGS. 13-15 illustrate some embodiments of cross-sectional views, 1300-1500, illustrating the iterative operation of method 300 to form additional metal interconnect layers (e.g., V1) in a back-end-of-the-line stack.

Referring to cross-sectional view 1300, a first SAM 106 is deposited onto the second ILD layer 104b, and a second SAM 112 is deposited onto the second metal interconnect layer M1. The second SAM 112 is removed from above the second metal interconnect layer M1 at an opening 116a that defines a metal interconnect layer area where a third metal interconnect layer is to be formed.

Referring to cross-sectional view 1400, a third metal interconnect layer V1 is formed on the second meal interconnect layer M1 at opening 116a. Since the second metal interconnect layer M1 is a conductive or catalyst material, there is no need for a metal catalyst layer to be deposited into opening 116a. Therefore, the resulting metal stack does not comprise a metal catalyst layer between the second and third metal interconnect layers, M1 and V1. Furthermore, since the third metal interconnect layer V1 is not formed above the second metal interconnect layer M1, the second SAM 112 is not removed from above the second metal interconnect layer M1.

Referring to cross-sectional view 1500, a third ILD layer 104c fills in areas between the metal structures of the third metal interconnect layer V1.

Figure 16:
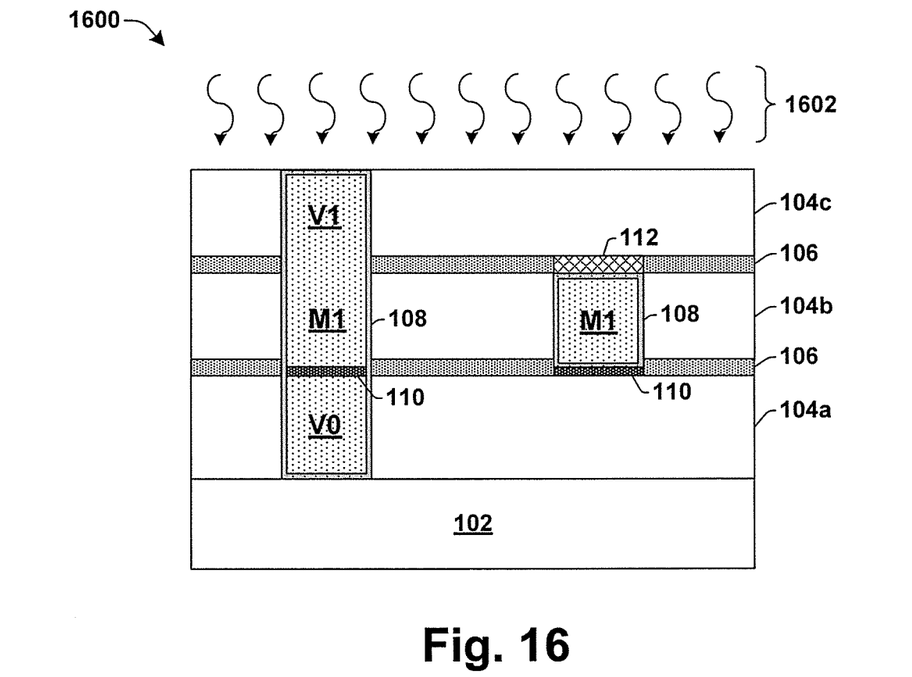

FIG. 16 is a cross-sectional view 1600 corresponding to act 320. As shown in cross-sectional view 1600, the substrate is annealed by exposing the substrate to thermal energy 1602 that raises the temperature of the substrate. The anneal causes the alloy dopant in metal interconnect layers V0, M1, and V1 to react with surrounding inter-level dielectric layers 104a, 104b, and 104c to form a self-forming barrier layer 108. The self-forming barrier layer 108 is positioned between the metal interconnect layers and the inter-level dielectric layer. In some embodiments, the self-forming barrier layer 108 comprises metal oxide or metal silicate oxide.

In some embodiments, the semiconductor substrate is exposed to a temperature of less than or equal to 400° C. The anneal time may vary depending on the alloy dopant element that is used to form the self-forming barrier layer. By changing the temperature and length of the anneal, the thickness of the self-forming barrier layer may be changed.

It will be appreciated that while reference is made throughout this document to exemplary structures in discussing aspects of methodologies described herein, those methodologies are not to be limited by the corresponding structures presented. For example, the methodologies set forth in FIG. 15 are not limited to the structure presented in FIGS. 6-15. Rather, the methodologies and structures are to be considered independent of one another and able to stand alone and be practiced without regard to any of the particular aspects depicted in the Figs. Additionally, layers described herein can be formed in any suitable manner, such as with spin on, sputtering, growth and/or deposition techniques, etc.

Also, equivalent alterations and/or modifications may occur to one of ordinary skill in the art based upon a reading and/or understanding of the specification and annexed drawings. The disclosure herein includes all such modifications and alterations and is generally not intended to be limited thereby. For example, although the figures provided herein are illustrated and described to have a particular doping type, it will be appreciated that alternative doping types may be utilized as will be appreciated by one of ordinary skill in the art.

In addition, while a particular feature or aspect may have been disclosed with respect to one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ from that illustrated herein.

Therefore, the present disclosure relates to a method of forming a back-end-of-the-line metal interconnect layer that reduces damage to a dielectric material surrounding the metal interconnect layer.

In some embodiments, the present disclosure relates a method of forming a metal back-end-of-the-line interconnect layer. The method comprises depositing one or more self-assembled monolayers on a semiconductor substrate to define a metal interconnect layer area. The method further comprises selectively depositing a metal interconnect layer comprising a plurality of metal structures on the semiconductor substrate within the metal interconnect layer area. The method further comprises depositing an inter-level dielectric layer onto the semiconductor substrate in areas between the plurality of metal structures.

In other embodiments, the present disclosure relates to a method of forming a back-end-of-the-line metal interconnect layer. The method comprises selectively depositing a first self-assembled monolayer (SAM) on an underlying first inter-level dielectric layer located on a substrate and selectively depositing a second self-assembled monolayer (SAM) on an underlying metal interconnect layer located on the substrate. The method further comprises selectively exposing the first SAM or the second SAM to radiation, wherein the radiation degrades a portion of the first SAM or the second SAM. The method further comprises removing the degraded portion of the first SAM or the second SAM. The method further comprises electrolessly plating a metal interconnect layer comprising a one or more metal at removed areas of the first SAM or the second SAM. The method further comprises selectively forming a second inter-level dielectric layer onto the substrate in areas between the plurality of metal structures. The method further comprises annealing the substrate after forming the second inter-level dielectric layer, wherein annealing the substrate forms a self-forming barrier layer between the plurality of metal structures and second inter-level dielectric layer.

In other embodiments, the present disclosure relates to an integrated chip, comprising a first metal interconnect layer disposed within a first inter-level dielectric layer. A first self-assembled monolayer (SAM) is located above the first inter-level dielectric layer and has one or more openings. A second inter-level dielectric layer is located on the first SAM. A second metal interconnect layer is disposed in the second inter-level dielectric layer and is located at the one or more openings in the first SAM.

What is claimed is:

1. A method of forming a metal back-end-of-the-line interconnect layer, comprising:
   selectively depositing a first self-assembled monolayer (SAM) contacting an underlying first inter-level dielectric (ILD) layer;
   selectively depositing a second self-assembled monolayer (SAM) on an underlying metal interconnect layer laterally surrounded by the first ILD layer; and
   removing a portion of the first SAM or the second SAM to form a metal interconnect layer area, wherein the first SAM or the second SAM is removed by using a photomask to selectively expose the first SAM or the second SAM to an ultraviolet radiation pattern that degrades a portion of the first SAM or a portion of the second SAM;
   selectively depositing a metal interconnect layer comprising a plurality of metal structures within the metal interconnect layer area; and
   depositing a second inter-level dielectric layer in areas between the plurality of metal structures.

2. The method of claim 1, wherein the first SAM comprises:
   a head group comprising trichlorosilicon ($SiCl_3$) or trimethoxysilane ($Si(OCH_3)_3$);
   an alkyl chain; and
   a terminal group comprising a methyl group.

3. The method of claim 1, wherein the second SAM comprises:
   a head group comprising sulfhydryl or thiol;
   an alkyl chain; and
   a terminal group comprising a methyl group.

4. The method of claim 1, wherein the metal interconnect layer comprises a copper metal or alloy deposited by an electroless plating process.

5. The method of claim 4, further comprising:
   depositing a metal catalyst layer that is confined along a planar surface within the metal interconnect layer area.

6. The method of claim 4, further comprising:
   inserting an alloy dopant into the copper metal during the electroless plating process, wherein the alloy dopant is configured to react with the second inter-level dielectric layer to form a self-forming barrier layer positioned between the metal interconnect layer and the second inter-level dielectric layer.

7. The method of claim 6, wherein the alloy dopant comprises one or more of: magnesium (Mg), aluminum (Al), chromium (Cr), manganese (Mn), titanium (Ti), zirconium (Zr), silver (Ag), niobium (Nb), boron (B), indium (In), tin (Sn), and molybdenum (Mo).

8. The method of claim 6, further comprising:
performing an annealing process after forming the second inter-level dielectric layer, wherein the annealing process forms the self-forming barrier layer.

9. The method of claim 1, wherein the first SAM and the second SAM respectively comprise an ordered assembly of organic molecules having a head group connected to a terminal group by a molecular chain.

10. A method of forming a back-end-of-the-line (BEOL) metal interconnect layer, comprising:
selectively depositing a first self-assembled monolayer (SAM) on an underlying first inter-level dielectric layer located over a substrate;
selectively depositing a second self-assembled monolayer (SAM) on an underlying metal interconnect layer located over the substrate;
selectively exposing the first SAM or the second SAM to radiation, wherein the radiation degrades a portion of the first SAM or the second SAM;
removing the degraded portion of the first SAM or the second SAM;
forming a first metal interconnect layer comprising one or more metal structures in areas exposed to the radiation;
selectively forming a second inter-level dielectric layer onto the substrate in areas between the one or more metal structures; and
annealing the substrate after forming the second inter-level dielectric layer, wherein annealing the substrate forms a self-forming barrier layer between the one or more metal structures and second inter-level dielectric layer.

11. The method of claim 10, further comprising:
selectively depositing a layer of palladium after removing a degraded portion of the first SAM or the second SAM.

12. The method of claim 10, further comprising:
forming one or more additional self-assembled monolayers over the first metal interconnect layer and the second inter-level dielectric layer;
selectively exposing one or more of the one or more additional self-assembled monolayers to additional radiation; and
forming an additional metal interconnect layer in areas exposed to the additional radiation.

13. The method of claim 12, further comprising:
selectively depositing a third inter-level dielectric layer in areas between a plurality of metal structures of the additional metal interconnect layer.

14. A method of forming a metal back-end-of-the-line interconnect layer, comprising:
depositing a plurality of self-assembled monolayers onto an underlying metal interconnect layer and an underlying ILD layer, which are arranged over a semiconductor substrate and that have upper surfaces aligned along a plane;
removing a portion of one or more of the plurality of self-assembled monolayers to form a metal interconnect layer area, wherein the portion of the one or more of the plurality of the self-assembled monolayers is removed by using a photomask to selectively expose the portion of the one or more of the plurality of the self-assembled monolayers to an ultraviolet radiation pattern that degrades the portion of the one or more of the plurality of the self-assembled monolayers;
selectively forming a metal interconnect layer comprising a plurality of metal structures within the metal interconnect layer area; and
depositing a second inter-level dielectric layer over the semiconductor substrate in areas between the plurality of metal structures.

15. The method of claim 14, wherein the metal interconnect layer is deposited by an electroless plating process.

16. The method of claim 15, further comprising:
inserting an alloy dopant into the metal interconnect layer during the electroless plating process, wherein the alloy dopant is configured to react with the second inter-level dielectric layer to form a self-forming barrier layer positioned between the metal interconnect layer and the second inter-level dielectric layer.

17. The method of claim 16, wherein the alloy dopant comprises one or more of: magnesium (Mg), aluminum (Al), chromium (Cr), manganese (Mn), titanium (Ti), zirconium (Zr), silver (Ag), niobium (Nb), boron (B), indium (In), tin (Sn), and molybdenum (Mo).

18. The method of claim 14, wherein the plurality of self-assembled monolayers are deposited to a thickness that is substantially equal.

19. The method of claim 14, wherein depositing the plurality of self-assembled monolayers, comprises:
selectively depositing a first self-assembled monolayer (SAM) on the underlying ILD layer overlying the semiconductor substrate;
selectively depositing a second self-assembled monolayer (SAM) on the underlying metal interconnect layer disposed within the underlying ILD layer;
using a photomask to selectively expose the first SAM and the second SAM to an ultraviolet radiation pattern, wherein the ultraviolet radiation pattern degrades a portion of the first SAM or a portion of the second SAM; and
removing the degraded portion the first SAM or the second SAM.

\* \* \* \* \*